(12) United States Patent
Liang et al.

(10) Patent No.: US 11,844,263 B2
(45) Date of Patent: Dec. 12, 2023

(54) DISPLAY PANEL HAVING ONE DISPLAY REGION SURROUNDING ANOTHER DISPLAYER REGION AND DISPLAY DEVICE HAVING THE SAME

(71) Applicant: Wuhan Tianma Micro-Electronics Co., Ltd., Wuhan (CN)

(72) Inventors: Yujiao Liang, Wuhan (CN); Yangzhao Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 52 days.

(21) Appl. No.: 17/581,243

(22) Filed: Jan. 21, 2022

(65) Prior Publication Data

US 2022/0149123 A1    May 12, 2022

Related U.S. Application Data

(63) Continuation of application No. 16/851,697, filed on Apr. 17, 2020, now Pat. No. 11,271,053.

(30) Foreign Application Priority Data

Dec. 31, 2019   (CN) .......................... 201911421050.6

(51) Int. Cl.
  *H01L 29/08*  (2006.01)
  *H10K 59/65*  (2023.01)
  (Continued)

(52) U.S. Cl.
  CPC ........... *H10K 59/65* (2023.02); *H10K 59/122* (2023.02); *H10K 59/124* (2023.02);
  (Continued)

(58) Field of Classification Search
  CPC .. H10K 59/65; H10K 59/122; H10K 59/1213; H10K 59/126; H10K 59/124; H01K 59/1216
  (Continued)

(56) References Cited

U.S. PATENT DOCUMENTS

2018/0006106 A1*  1/2018  Oh ....................... H10K 71/233
2019/0074333 A1   3/2019  Rappoport et al.
  (Continued)

FOREIGN PATENT DOCUMENTS

TW           I549291 B       9/2016

*Primary Examiner* — Phuc T Dang
(74) *Attorney, Agent, or Firm* — ANOVA LAW GROUP PLLC

(57) ABSTRACT

A display panel is provided in the present disclosure. The display panel includes a first display region and a second display region, and a first substrate including a first base substrate. The first display region includes: a plurality of organic light-emitting elements on the first base substrate, a first sub-display region and a second sub-display region. The first sub-display region includes a plurality of first sub-light-transmitting holes. The plurality of first sub-light-transmitting holes do not overlap the plurality of organic light-emitting elements along a direction perpendicular to a plane of the first base substrate, and the plurality of first sub-light-transmitting holes are non-rectangular. The second sub-display region includes a plurality of second sub-light-transmitting holes. The plurality of second sub-light-transmitting holes do not overlap the plurality of organic light-emitting elements along a direction perpendicular to a plane of the first base substrate, and the plurality of second sub-light-transmitting holes are non-rectangular.

20 Claims, 12 Drawing Sheets

(51) Int. Cl.
*H10K 59/122* (2023.01)
*H10K 59/124* (2023.01)
*H10K 59/126* (2023.01)
*H10K 59/121* (2023.01)

(52) U.S. Cl.
CPC ....... *H10K 59/126* (2023.02); *H10K 59/1213* (2023.02); *H10K 59/1216* (2023.02)

(58) Field of Classification Search
USPC .......................................................... 257/40
See application file for complete search history.

(56) References Cited

U.S. PATENT DOCUMENTS

| | | | |
|---|---|---|---|
| 2019/0095674 A1* | 3/2019 | Ko | ..................... H01L 31/02327 |
| 2020/0066825 A1 | 2/2020 | Yang et al. | |
| 2020/0104562 A1* | 4/2020 | Sung | ..................... H10K 59/60 |
| 2020/0176519 A1 | 6/2020 | Seo et al. | |
| 2020/0310180 A1* | 10/2020 | Fu | ....................... G02F 1/13439 |

* cited by examiner

DISPLAY PANEL HAVING ONE DISPLAY REGION SURROUNDING ANOTHER DISPLAYER REGION AND DISPLAY DEVICE HAVING THE SAME

CROSS-REFERENCE TO RELATED APPLICATION

This application is a continuation application of U.S. patent application Ser. No. 16/851,697, filed on Apr. 17, 2020, and issued on Mar. 08, 20022 with U.S. Pat. No. 11,271,053 which claims the priority of Chinese Patent Application No. 201911421050.6, filed on Dec. 31, 2019, the content of which is incorporated herein by reference in its entirety.

TECHNICAL FIELD

The present disclosure generally relates to the field of display technology and, more particularly, relates to a display panel and a display device.

BACKGROUND

With the development of mobile phones, display panels, cameras, and other consumer electronics, in addition to their functionality, more demands are shifted to other aspects including design, artistry, and desirable visual experience. For example, full-screen displays having high screen-to-body ratios become increasingly popular.

Taking the mobile phone as an example, since components, including cameras, light sensors and the like, are required to be disposed at the front of the mobile phone, a non-display region may be designed at the top of the display in the existing solutions. Current solutions include use of bang displays, water drop displays and the like, which however, is difficult in achieving the real full-screen display effect.

SUMMARY

One aspect of the present disclosure provides a display panel. The display panel includes a first display region, a second display region, and a first substrate including a first base substrate. The second display region at least partially surrounds the first display region. The first display region includes: a plurality of organic light-emitting elements on the first base substrate; and a first sub-display region and a second sub-display region. The first sub-display region includes a plurality of first sub-light-transmitting holes. The plurality of first sub-light-transmitting holes do not overlap the plurality of organic light-emitting elements along a direction perpendicular to a plane of the first base substrate, and the plurality of first sub-light-transmitting holes are non-rectangular. The second sub-display region includes a plurality of second sub-light-transmitting holes. The plurality of second sub-light-transmitting holes do not overlap the plurality of organic light-emitting elements along a direction perpendicular to a plane of the first base substrate, and the plurality of second sub-light-transmitting holes are non-rectangular. At least one of the plurality of first sub-light-transmitting holes and at least one of the plurality of second sub-light-transmitting holes have different shapes.

Another aspect of the present disclosure provides a display device including the display panel in the embodiments of the present disclosure. The display panel includes a first display region, a second display region, and a first substrate including a first base substrate. The second display region at least partially surrounds the first display region. The first display region includes: a plurality of organic light-emitting elements on the first base substrate; and a first sub-display region and a second sub-display region. The first sub-display region includes a plurality of first sub-light-transmitting holes. The plurality of first sub-light-transmitting holes do not overlap the plurality of organic light-emitting elements along a direction perpendicular to a plane of the first base substrate, and the plurality of first sub-light-transmitting holes are non-rectangular. The second sub-display region includes a plurality of second sub-light-transmitting holes. The plurality of second sub-light-transmitting holes do not overlap the plurality of organic light-emitting elements along a direction perpendicular to a plane of the first base substrate, and the plurality of second sub-light-transmitting holes are non-rectangular. At least one of the plurality of first sub-light-transmitting holes and at least one of the plurality of second sub-light-transmitting holes have different shapes.

Other aspects of the present disclosure can be understood by those skilled in the art in light of the description, the claims, and the drawings of the present disclosure.

BRIEF DESCRIPTION OF THE DRAWINGS

In order to explain the technical solutions in the embodiments of the present disclosure or the existing technology more clearly, the drawings used in the description of the embodiments or the existing technology are briefly introduced hereinafter. Obviously, the drawings in the following description are merely certain embodiments of the present disclosure, and for those skilled in the art, other drawings may be obtained according to these drawings without creative efforts.

DETAILED DESCRIPTION

The technical solutions in the embodiments of the present disclosure may be clearly and completely described with reference to the drawings in the embodiments of the present disclosure hereinafter. Obviously, the described embodiments are merely a part of the embodiments of the present disclosure, but not all of the embodiments. All other embodiments, based on the embodiments in the present disclosure, obtained by those skilled in the art without creative efforts shall fall within the protection scope of the present disclosure.

Figure 1:
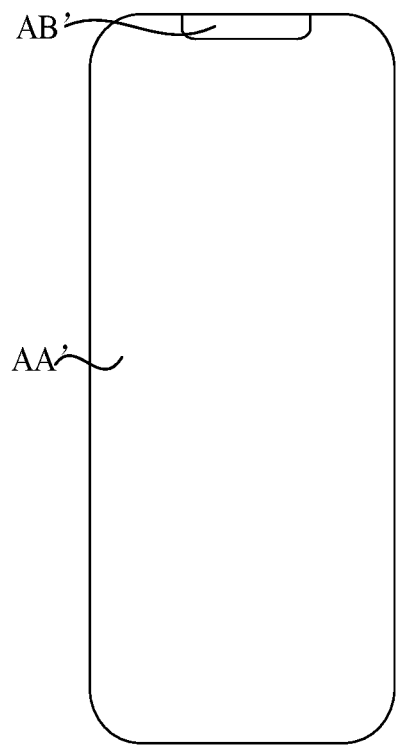
FIG. 1 illustrates a structural schematic of a display panel in the existing technology.

FIG. 1 illustrates a structural schematic of a display panel in the existing technology. As shown in FIG. 1, the display panel in the existing technology may include a non-display region AB' and a display region AA' surrounding the non-display region AB', where the non-display region AB' may be a reserved region for sensors. It can be seen from FIG. 1 that it is difficult to achieve a real full-screen display effect due to the existence of the non-display region AB'.

The embodiments of the present disclosure provide a display panel. The display panel may include a first display region and a second display region surrounding the first display region. The display panel may further include a first substrate, and the first substrate may include a first base substrate. The first display region may include a plurality of light-emitting units on the first base substrate. The light-emitting units may include drive circuits and organic light-emitting elements, and the drive circuits may be used to drive the organic light-emitting elements to emit light. The first display region may include a plurality of first light-transmitting holes, the first light-transmitting holes may not overlap the light-emitting units along a direction perpendicular to the plane of the first base substrate, and the first light-transmitting holes may be non-rectangular. The first display region may include a first sub-display region and a second sub-display region. In the first sub-display region, the sum of the areas of the first light-transmitting holes per unit area is S1 and in the second sub-display region, the sum of the areas of the first light-transmitting holes per unit area is S2, where S1>S2. By disposing the plurality of first light-transmitting holes in the first display region in the above-mentioned technical solution, external light may enter a camera on the backlight side of the display panel through the plurality of the first light-transmitting holes to ensure that the camera receives sufficient light, thereby satisfying the image capturing function of the camera. Meanwhile, by disposing the plurality of first light-emitting units in the first display region, when the display panel is required for performing display, the normal display of the first display region may be achieved through the plurality of light-emitting units, thereby increasing the body-to-screen ratio of the display panel and achieving the full-screen display. In addition, since the first light-transmitting holes are non-rectangular, the diffraction may be effectively reduced when the light passes through the first light-transmitting holes, and the image forming quality of the camera which is located on the backlight side of the display panel and corresponds to the first display region AA. Furthermore, since the sum S1 of the areas of the first light-transmitting holes per unit area in the first sub-display region is greater than the sum S2 of the areas of the first light-transmitting holes per unit area in the second sub-display region, that is, the first light-transmitting holes are arranged irregularly in the first display region, the diffraction may be further be avoided to improve the image forming quality.

The essential concept of the present disclosure is explained in the above-mentioned description. The technical solutions in the embodiments of the present disclosure may be clearly and completely described with reference to the drawings in the embodiments of the present disclosure hereinafter. The described embodiments are merely a part of the embodiments of the present disclosure, but not all of the embodiments. All other embodiments, based on the embodiments in the present disclosure, obtained by those skilled in the art without creative efforts shall fall within the protection scope of the present disclosure.

Figure 2:
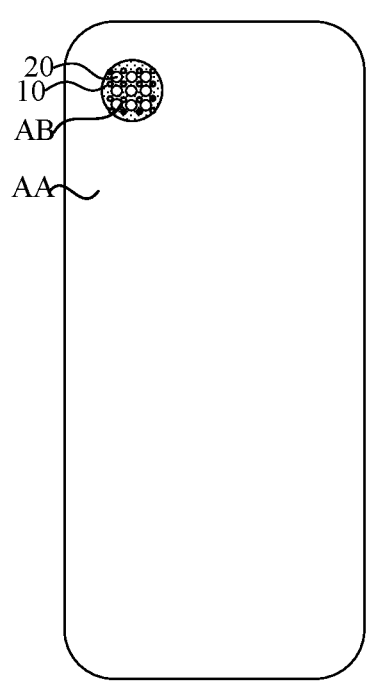
FIG. 2 illustrates a structural schematic of a display panel according to embodiments of the present disclosure.
Figure 3:
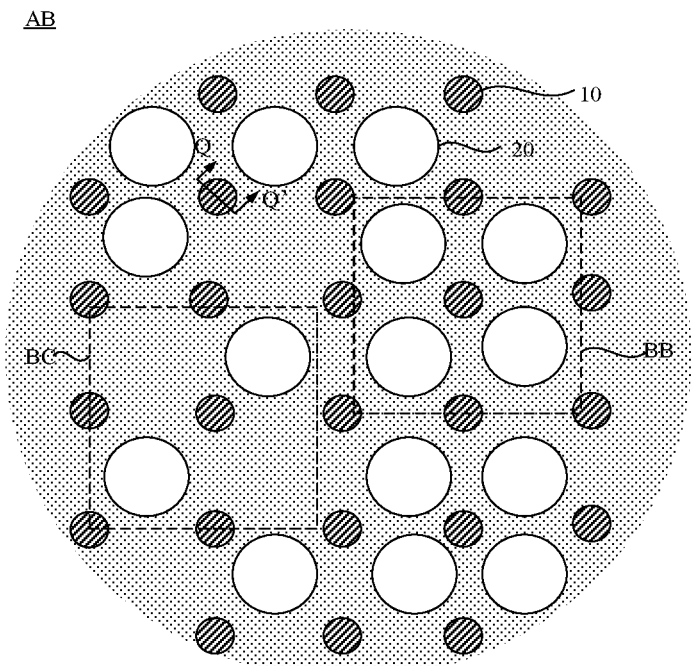
FIG. 3 illustrates a local structural schematic of a first display region according to embodiments of the present disclosure.
Figure 4:
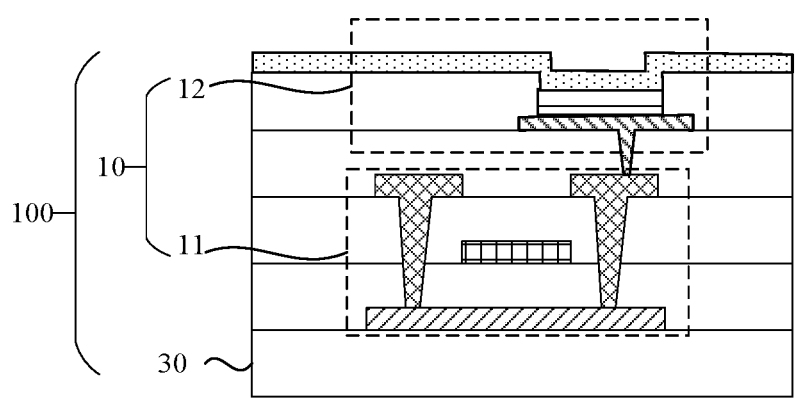
FIG. 4 illustrates a cross-sectional structural view along a QQ' direction in FIG. 3.

FIG. 2 illustrates a structural schematic of a display panel according to embodiments of the present disclosure. FIG. 3 illustrates a local structural schematic of the first display region according to embodiments of the present disclosure. FIG. 4 illustrates a cross-sectional structural view along a QQ' direction in FIG. 3. As shown in FIGS. 2-4, the display panel provided in one embodiment may include a first display region AB and a second display region AA surrounding the first display region AB. The display panel may further include a first substrate 100, and the first substrate 100 may include a first base substrate 30. The first display region AB may include a plurality of light-emitting units 10 on the first base substrate 30. The light-emitting units 10 may include drive circuits 11 and organic light-emitting elements 12, and the drive circuits 11 may be used to drive the organic light-emitting elements 12 to emit light. The first display region AB may include a plurality of first light-transmitting holes 20, the first light-transmitting holes 20 may not overlap the light-emitting units 10 along a direction perpendicular to the plane of the first base substrate 30, and the first light-transmitting holes 20 may be non-rectangular. The first display region AB may include a first sub-display region BB and a second sub-display region BC. In the first sub-display region BB, the sum of the areas of the first light-transmitting holes 20 per unit area is S1 and in the second sub-display region BC, the sum of the areas of the first light-transmitting holes 20 per unit area is S2, where S1>S2.

It can be understood that the display panel provide in the embodiments of the present disclosure is suitable for a display device that needs to have a sensor disposed under the screen, where the sensor may be, for example, a camera. Since the shape of the corresponding area of the camera is circular, the first display region AB is exemplarily illustrated as a circular area in FIGS. 2-3, which may not be limited according to the embodiments of the present disclosure, and the first display region AB may be a polygonal region, an elliptical region, and the like. Furthermore, the position of the first display region AB in the display panel may not be limited in one embodiment, and the first display region AB at the upper left corner of the display panel is exemplarily illustrated in FIG. 2. In other optional embodiments, the first display region AB may also be located at the center region of the display panel or any other suitable regions, which may not be limited according to the embodiments of the present disclosure. The light-emitting unit 10 may include the drive circuit 11 and the organic light-emitting element 12, where the drive circuit 11 may be used to drive the organic light-emitting element 12 to enable the organic light-emitting element 12 to emit light, thereby displaying pictures to be displayed. The first display region AB may include the plurality of the first light-transmitting holes 20, and the areas of all the first light-transmitting holes 20 may be equal to each other.

For example, in one embodiment, the second display region AA may include a plurality of light-emitting units (not shown) on the first base substrate 30, thereby enabling the second display region AA to display pictures; and the first display region AB may also include the plurality of light-emitting units 10 on the first base substrate 30. That is, the display panel may performs displaying pictures not only through the second display region AA and also through the first display region AB, thereby achieving the full screen display of the display panel. Meanwhile, the first display region AB may also include the plurality of first light-transmitting holes 20, and the first light-transmitting holes 20 may not overlap the light-emitting units 10 along the direction perpendicular to the plane of the first base substrate 30. External light may enter the camera on the backlight side of the display panel through the plurality of the first light-transmitting holes 20 to ensure that the camera receives sufficient light, thereby satisfying the image capturing function of the camera. That is, the first display region AB may not only satisfy the image capturing function of the camera, but also achieve the normal display. Based on the ensuring the image capturing function of the camera, the technical solution in the present disclosure may increase the screen-to-body ratio of the display panel and achieve the full-screen display effect.

Furthermore, when the light-transmitting holes 20 are rectangular and also arranged regularly, external light is diffracted easily through the light-transmitting holes 20. In the embodiments of the present disclosure, the plurality of first light-transmitting holes 20 are set to be non-rectangular; the sum of the areas of the first light-transmitting holes 20 per unit area is set to be S1 in the first sub-display region BB; and the sum of the areas of the first light-transmitting holes 20 per unit area is set to be S2 in the second sub-display region BC, where S1>S2. That is, the light-transmitting holes 20 are non-rectangular and also arranged irregularly. Therefore, the diffraction may be avoided when the external light passes through the plurality of the first light-transmitting holes 20, thereby improving the image forming quality of the camera which is on the backlight side of the display panel and corresponds to the first display region AB.

In the embodiments of the present disclosure, by disposing the plurality of first light-transmitting holes in the first display region, external light may enter the camera on the backlight side of the display panel through the plurality of the first light-transmitting holes to ensure that the camera receives sufficient light, thereby satisfying the image capturing function of the camera. Meanwhile, by disposing the plurality of first light-emitting units in the first display region, when the display panel is required for performing display, the normal display of the first display region may be achieved through the plurality of light-emitting units, thereby increasing the body-to-screen ratio of the display panel and achieving the full-screen display. In addition, since the first light-transmitting holes are non-rectangular, the diffraction may be effectively reduced when the light passes through the first light-transmitting holes, and the image forming quality of the camera which is on the backlight side of the display panel and corresponds to the first display region AA may be improved. Furthermore, since the sum S1 of the areas of the first light-transmitting holes per unit area in the first sub-display region is greater than the sum S2 of the areas of the first light-transmitting holes per unit area in the second sub-display region, that is, the first light-transmitting holes are arranged irregularly in the first display region, the diffraction may be further be avoided to improve the image forming quality.

Figure 5:
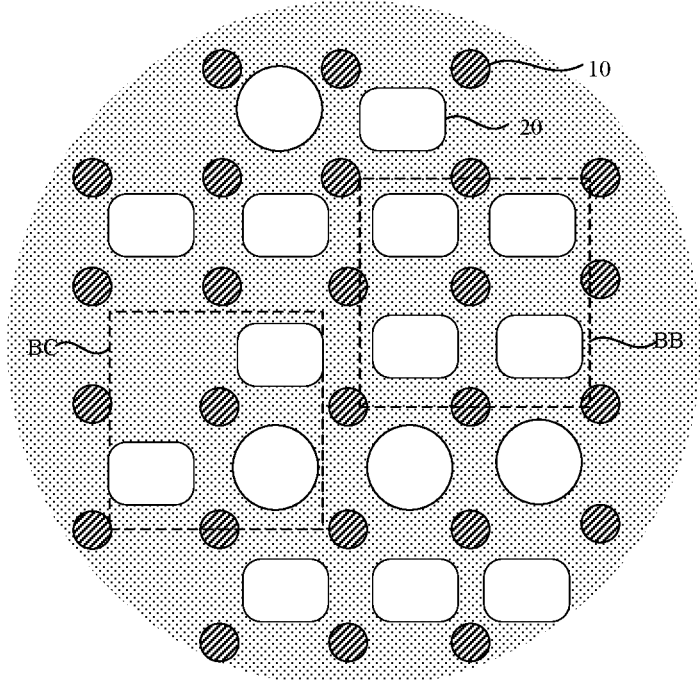
FIG. 5 illustrates another local structural schematic of a first display region according to embodiments of the present disclosure.

Optionally, a shape of the first light-transmitting hole 20 may include at least one type of a circle, an ellipse, and a rounded polygon. The shapes of the first light-transmitting holes 20 are exemplarily illustrated only as circles in FIGS. 2-3. In other optional embodiments, the shapes of the first light-transmitting holes 20 may merely include at least one of ellipses and rounded polygons and may also include a combination of the plurality of shapes. Exemplarily, FIG. 5 illustrates another local structural schematic of the first display region according to embodiments of the present disclosure. As shown in FIG. 5, the shapes of the first light-transmitting holes 20 may include the combination of rounded rectangles and circles.

It should be noted that the shapes of the first light-transmitting holes 20 may include, but may not be limited to, the above-mentioned examples, and those skilled in the art may set the shapes of the first light-transmitting holes 20 according to product needs, which may not be limited in the embodiments of the present disclosure, as long as the light can be prevented from diffracting when passing through the first light-transmitting holes 20.

It should be understood that, although the shapes of the first light-transmitting holes are different, the areas of the plurality of the first light-transmitting holes are equal to each other.

It should be understood that the first light-transmitting holes 20 may be formed in various manners, and in order to clearly show the difference between the first light-transmitting holes 20 and the light-emitting units 10 from other regions, the regions other than the first light-transmitting holes 20 and the light-emitting units 10 may be filled with different filling patterns from the first light-transmitting holes 20 and the light-emitting units 10. The following embodiments may have the same filling patterns and may not be described in detail herein. The formation of the first light-transmitting holes 20 is described in the following embodiments in detail.

Optionally, the first light-transmitting holes 20 may be formed in various manners, which may be described in detail in some embodiments hereinafter.

Figure 6:
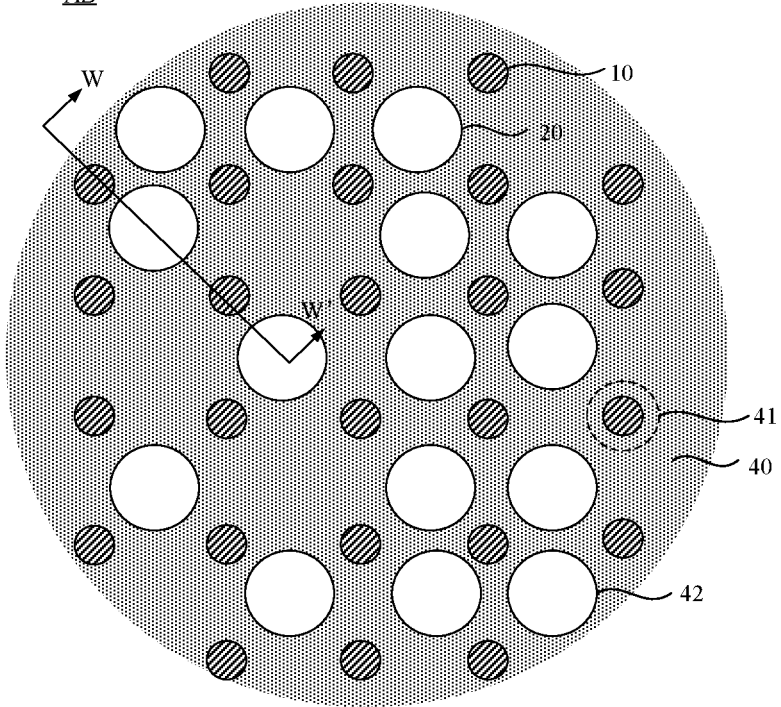
FIG. 6 illustrates another local structural schematic of a first display region according to embodiments of the present disclosure.
Figure 7:
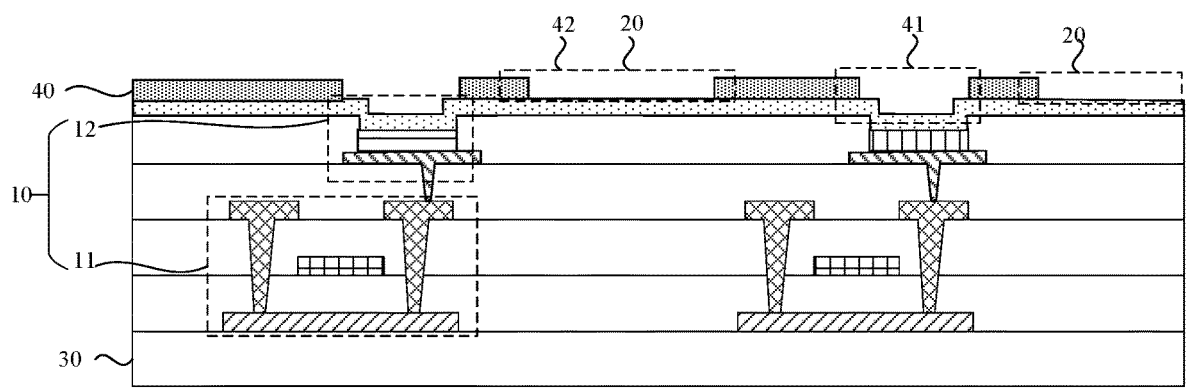
FIG. 7 illustrates a cross-sectional structural view along a WW' direction in FIG. 6.

Optionally, FIG. 6 illustrates another local structural schematic of the first display region according to embodiments of the present disclosure. FIG. 7 illustrates a cross-sectional structural view along a WW' direction in FIG. 6. As shown in FIGS. 6-7, the display panel may further include a light-shielding layer 40 which is at the first display region AB and on the first base substrate 30. The light-shielding layer 40 may include a plurality of first openings 41 and a plurality of second openings 42. Along the direction perpendicular to the plane of the first base substrate 30, the organic light-emitting elements 12 may at least partially overlap the first openings 41. The second openings 42 may be used as be the first light-transmitting holes 20.

The display panel may further include metal wiring (not shown) on the first base substrate 30, and the metal wiring may include, for example, data lines and scan lines. Gaps may be between the metal wiring, and the diffraction may occur easily when the external light passes through the metal wiring. In such way, after the external light entering the display panel is received by the camera on the backlight side of the display panel, the image forming quality may be affected. Therefore, in one embodiment, the light-shielding layer 40 is disposed on the first base substrate 30, and the diffraction of the external light by the gaps between the metal wiring may be effectively avoided through the shielding of the metal wiring by the light-shielding layer 40. Meanwhile, the light-shielding layer 40 may include the plurality of first openings 41 and the plurality of second openings 42. Along the direction perpendicular to the plane of the first base substrate 30, the organic light-emitting elements 12 may at least partially overlap the first openings 41, such that the light emitted from the organic light-emitting elements 12 may be passed through the first openings 41, thereby implementing the normal display of the first display region AB. The second openings 42 may be used as the first light-transmitting holes 20, such that the external light may be received by the camera or other light-sensing elements on the backlight side of the display panel through the second openings 42, thereby satisfying the corresponding functions thereof. In such way, while the display of the first display region AB is not affected, the occurrence of diffraction may also be avoided.

Optionally, the light-shieling layer 40 may be made of one of a black photoresist or a black metal.

It should be noted that the material of the light-shielding layer 40 may include, but may not be limited to, the materials in the above-mentioned embodiments, and those skilled in the art may select the material of the light-shielding layer 40 according to actual situations, which may not be limited in one embodiment.

It should be noted that the film layer position of the light-shielding layer 40 may not be limited in one embodiment, as long as the diffraction of the external light by the gaps between the metal wiring is effectively avoided through the light-shielding layer 40. FIG. 7 may only use the light-shielding layer 40 on the side of the organic light-emitting element 12 away from the first base substrate 30, that is, the light-shielding layer 40 is separately disposed, as an example for illustration. However, the light-shielding layer 40 may also be disposed in the same layer as the film layer in the display panel, which may avoid the diffraction and reduce the process steps. The light-shielding layer 40 and the film layer in the display panel are disposed at the same layer as an example for illustration hereinafter.

Figure 8:
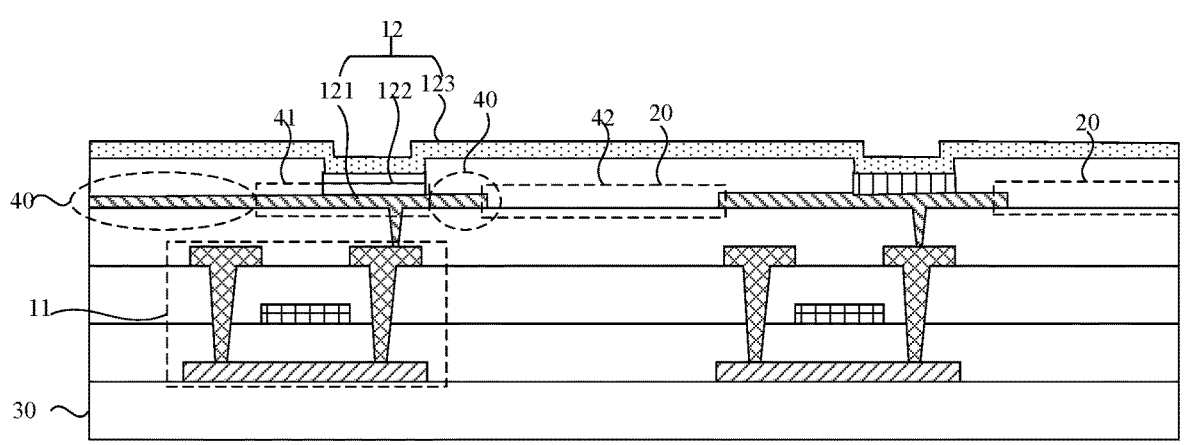
FIG. 8 illustrates a local structural schematic of a film layer of a first display region according to embodiments of the present disclosure.

Optionally, FIG. 8 illustrates a local structural schematic of a film layer of the first display region according to embodiments of the present disclosure. As shown in FIG. 8, the organic light-emitting element 12 may include an anode 121 on the side of the drive circuit 11 away from the first base substrate 30, a light-emitting layer 122 on the side of the anode 121 away from the drive circuit 11, and a cathode 123 on the light-emitting layer 122 away from the anode 121. The anode 121 and the light-shielding layer 40 may be made of a same material and disposed in a same layer.

The anode 121 of the organic light-emitting element 12 in one embodiment may be formed with indium tin oxide, silver, and indium tin oxide (ITO+Ag+ITO). When an anode layer is formed, Ag may be retained as the light-shielding layer 40. By forming the anode 121 and the light-shielding layer 40 in a same process using a same material, that is, the light-shielding layer 40 and the anode 121 are formed simultaneously, this is no need to add an additional process, which may reduce the process flow and the manufacturing cost of the display panel. Meanwhile, compared with that the anode 121 and the light-shielding layer 40 are respectively disposed at different film layers, the anode 121 and the light-shielding layer 40 in one embodiment are disposed at a same layer to reduce the overall thickness of the display panel.

Figure 9:
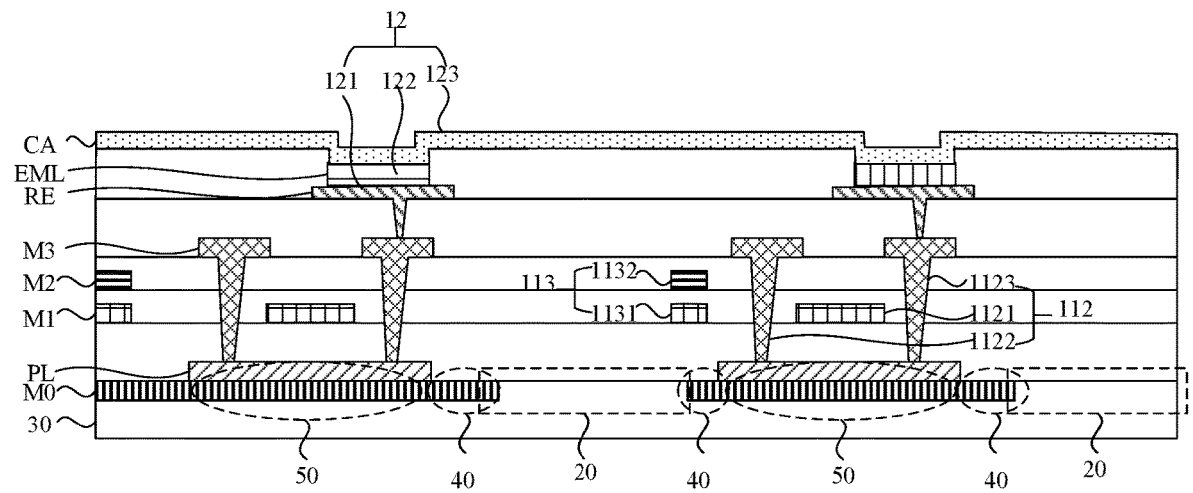
FIG. 9 illustrates another local structural schematic of a film layer of a first display region according to embodiments of the present disclosure.

Optionally, FIG. 9 illustrates another local structural schematic of a film layer of the first display region according to embodiments of the present disclosure. As shown in FIG. 9, the drive circuit 11 may include a thin film transistor 112 and a storage capacitor 113; the storage capacitor 113 may include a first electrode plate 1131 and a second electrode plate 1132; the thin film transistor 112 may include a gate electrode 1121, a source electrode 1122, and a drain electrode 1123; and the organic light-emitting element 12 may include the anode 121, the light-emitting layer 122, and the cathode 123. The display panel may include a blocking layer M0 on the first base substrate 30, an active layer PL on the side of the blocking layer M0 away from the first base substrate 30, a first metal layer M1 on the side of the active layer PL away from the first base substrate 30, a second metal layer M2 on the side of the first metal layer M1 away from the first base substrate 30, a third metal layer M3 on the side of the second metal layer M2 away from the first base substrate 30, an anode layer RE on the side of the third metal layer M3 away from the first base substrate 30, an light-emitting layer EML on the side of the anode layer RE away from the first base substrate 30, and a cathode layer CA on the side of the light-emitting layer EML away from the first base substrate 30. The blocking layer M0 may include a light-shielding portion 50 which is on the side of the gate electrode 1121 of the thin film transistor 112 adjacent to the first base substrate 30. Furthermore, the light-shielding portion 50 may be on the side of the active layer PL adjacent to the first base substrate 30. The first metal layer M1 may include the gate electrode 1121 of the thin film transistor 112 and the first electrode plate 1131 of the storage capacitor 113. The second metal layer M2 may include the second electrode plate 1132 of the storage capacitor 113. The third metal layer M3 may include the source electrode 1122 and the drain electrode 1123 of the thin film transistor 112.

Considering that certain impurity ions precipitated from the first base substrate 30 may enter the channel of the thin film transistor 112 to affect the performance of the thin film transistor 112, the light-shielding portion 50 is disposed between the first base substrate 30 and the thin film transistor 112 in one embodiment. The thin film transistor 112 may be blocked by the light-shielding portion 50, such that certain impurity ions precipitated from the first base substrate 30 may be blocked from entering the channel of the thin film transistor 112 and the impurity ions may be prevented from affecting the performance of the thin film transistor 112.

Optionally, the display panel may further include power signal lines (not shown) which include first power signal lines extending along a column direction and second power signal lines extending along a row direction. The first power signal lines are laterally connected through the second power signal lines, thereby reducing the voltage drop of the power signal. The second metal layer M2 may further include the second power signal lines in addition to the second electrode plate 1132 of the storage capacitor 113, and the third metal layer M3 may further include the first power signal lines in addition to the source electrode 1122 and the drain electrode 1123 of the thin film transistor 112. In the technical solution of the present disclosure, the first power signal lines and the second power signal lines of the power signal lines may be respectively disposed on the third metal layer M3 and the second metal layer M2, thereby reducing the voltage drop of the power signal and the process flow.

Optionally, referring to FIG. 9, the blocking layer M0 may further include the light-blocking layer 40.

In one embodiment, by forming the light-shielding layer 40 and the light-shielding portion 50 in a same process using a same material, that is, the light-shielding layer 40 and the light-shielding portion 50 are formed simultaneously, this is no need to add an additional process, which may reduce the process flow and the manufacturing cost of the display panel. Meanwhile, compared with that the light-shielding layer 40 and the light-shielding portion 50 are respectively disposed at different film layers, the light-shielding layer 40 and the light-shielding portion 50 in one embodiment are disposed at a same layer to reduce the overall thickness of the display panel.

Figure 10:
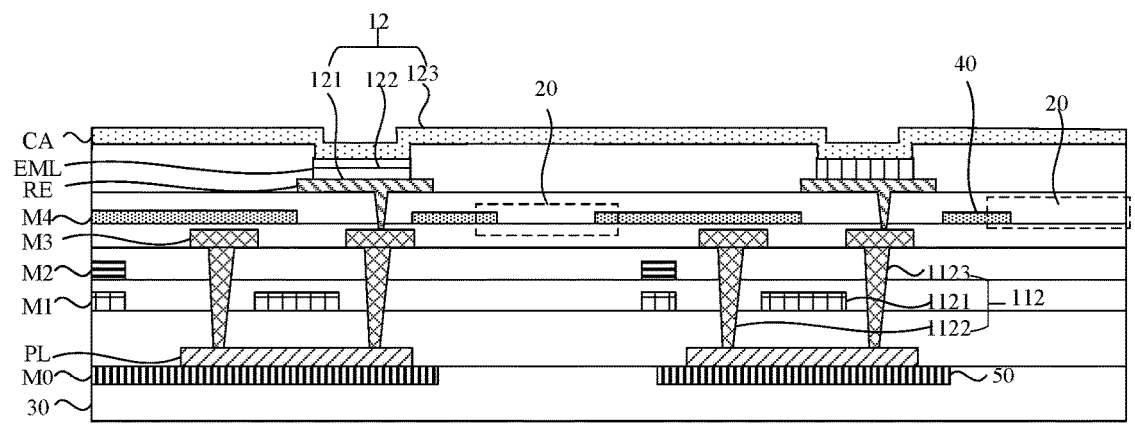
FIG. 10 illustrates another local structural schematic of a film layer of a first display region according to embodiments of the present disclosure.

Optionally, FIG. 10 illustrates another local structural schematic of a film layer of the first display region according to embodiments of the present disclosure. As shown in FIG. 10, the display panel may further include a fourth metal layer M4 on the side of the third metal layer M3 away from the first base substrate 30; and the fourth metal layer M4 may include the light-shielding layer 40.

In one embodiment, since the display panel further includes the fourth metal layer M4 on the side of the third metal layer M3 away from the first base substrate 30 and the fourth metal layer M4 includes the light-shielding layer 40, the diffraction of the external light by the gaps between the metal wiring may be effectively avoided through blocking the metal wiring between adjacent light-emitting elements 10 by the light-shielding layer 40, thereby improving the image forming quality of the camera.

Optionally, the display panel may further include data lines (not shown) which include first data lines and second data lines extending along a column direction. The third metal layer M3 may further include the first data lines in addition to the source electrode 1122 and the drain electrode 1123 of the thin film transistor 112, and the fourth metal layer M4 may further include the second data lines in addition to the light-shielding layer 40. The first data lines and the second data lines may be connected by punching holes. In the technical solution of the present disclosure, the first data lines and the second data lines may be respectively disposed at the third metal layer M3 and the fourth metal layer M4, thereby reducing the voltage drop of the power signal and the process flow.

Based on the above-mentioned embodiments, it should be noted that the light-shielding layer 40 may block the metal wiring between adjacent light-emitting elements 10, which may effectively avoid the diffraction of external light by the gaps between the metal wiring. In addition, the light-shielding layer 40 may also include the plurality of first openings 41 and the plurality of second openings 42. Along the direction perpendicular to the plane of the first base substrate 30, the organic light-emitting elements 12 may at least partially overlap the first openings 41, such that the light emitted by the organic light-emitting elements 12 may be passed through the first openings 41, thereby implementing the normal display of the first display region AB. The second openings 42 may be used as the first light-transmitting holes 20, such that the external light may be received by the camera or other light-sensing elements on the backlight side of the display panel through the second openings 42, thereby satisfying the corresponding functions thereof. In such way, while the display of the first display region AB is not affected, the occurrence of diffraction may also be avoided. Furthermore, the light-shielding layer 40 and the film layer structure in the display panel, for example the anode 121 or the light-shielding portion 50, are disposed at a same layer, such that this is no need to add an additional process, which may reduce the process flow and the manufacturing cost of the display panel.

Figure 11:
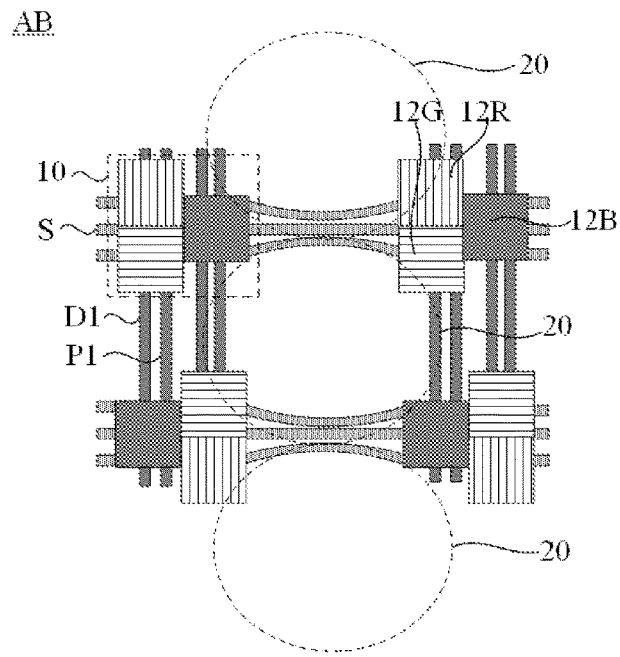
FIG. 11 illustrates another local structural schematic of a first display region according to embodiments of the present disclosure.

Optionally, FIG. 11 illustrates another local structural schematic of the first display region according to embodiments of the present disclosure. As shown in FIG. 11, along the direction perpendicular to the plane of the first base substrate 30, the first light-transmitting hole 20 may be an area enclosed by adjacent light-emitting units and the connecting wiring between adjacent light-emitting units.

It can be understood that, along the direction perpendicular to the plane of the first base substrate 30, the first light-transmitting hole 20 may be an area enclosed by adjacent light-emitting units and the connecting wiring between adjacent light-emitting units. That is, any wiring may not be disposed at the area corresponding to the first light-transmitting hole 20. In such way, external light may enter the camera on the backlight side of the display panel through the plurality of first light-transmitting holes 20 to ensure that the camera receives sufficient light, thereby satisfying the image capturing function of the camera.

It can be understood that the light-emitting unit 10 may include the plurality of organic light-emitting elements 12. For example, the light-emitting unit 10 may include an organic light-emitting element 12R which emits red light, an organic light-emitting element 12G which emits green light, and an organic light-emitting element 12B which emits blue light. Each light-emitting element 12 may be driven to emit light by the drive circuit 11, where the drive circuit 11 may further include a scan line S extending along the row direction, and a data line D1 and a power signal line P1 extending along the column direction. The connecting wiring between adjacent light-emitting units 10 may include scan lines S extending along the row direction, and data lines D1 and power signal lines P1 extending along the column direction. Referring to FIG. 11, when the scan lines S, the data lines D1 and the power signal lines P1 are fabricated, the scan lines S, the data lines D1 and the power signal lines P1 may be set to have a curved shape of the vertical projection on the plane of the first base substrate 30. In such way, a non-rectangular first light-transmitting hole 20 may be formed by being surrounded by adjacent four light-emitting elements 10 and the scan lines S, the data lines D1 and the power signal lines P1 between the four adjacent light-emitting elements 10. In one embodiment, along the direction perpendicular to the plane of the first base substrate 30, the non-rectangular first light-transmitting hole 20 may be formed by being surrounded by adjacent four light-emitting elements 10 and the scan lines S, the data lines D1 and the power signal lines P1 between the four adjacent light-emitting elements 10, which enable the external light to be received by the camera or other light-sensing element outside the display panel through the first light-transmitting hole 20 to satisfy the corresponding function thereof. Since the first light-transmitting hole 20 is non-rectangular, the diffraction of the external light may be avoided when the external light passes through the light-transmitting region, thereby improving the image forming quality of the camera which is on the backlight side of the display panel and corresponds to the first display region AB.

Figure 12:
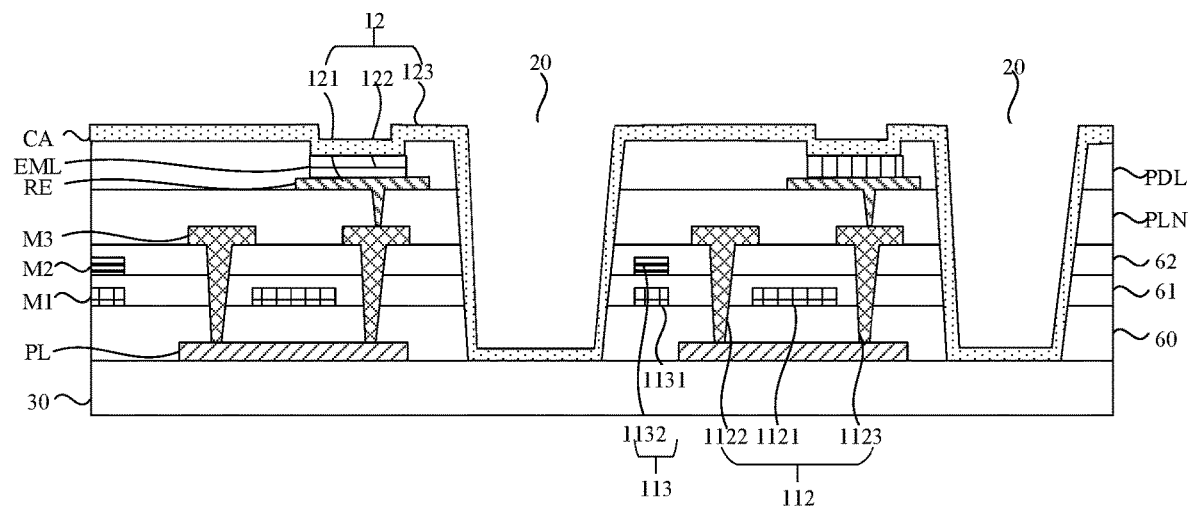
FIG. 12 illustrates another local structural schematic of a film layer of a first display region according to embodiments of the present disclosure.

Optionally, FIG. 12 illustrates another local structural schematic of a film layer of the first display region according to embodiments of the present disclosure. As shown in FIG. 12, the drive circuit 11 may include the thin film transistor 112 and the storage capacitor 113; the storage capacitor 113 may include the first electrode plate 1131 and the second electrode plate 1132; the thin film transistor 112 may include the gate electrode 1121, the source electrode 1122, and the drain electrode 1123; and the organic light-emitting element 12 may include the anode 121, the light-emitting layer 122, and the cathode 123. The display panel may include the active layer PL on the side of the blocking layer M0 away from the first base substrate 30, the first metal layer M1 on the side of the active layer PL away from the first base substrate 30, the second metal layer M2 on the side of the first metal layer M1 away from the first base substrate 30, the third metal layer M3 on the side of the second metal layer M2 away from the first base substrate 30, the anode layer RE on the side of the third metal layer M3 away from the first base substrate 30, the light-emitting layer EML on the side of the anode layer RE away from the first base substrate 30, and the cathode layer CA on the side of the light-emitting layer EML away from the first base substrate 30. The first metal layer M1 may include the gate electrode 1121 of the thin film transistor 112 and the first electrode plate 1131 of the storage capacitor 113. The second metal layer M2 may include the second electrode plate 1132 of the storage capacitor 113. The third metal layer M3 may include the source electrode 1122 and the drain electrode 1123 of the thin film transistor 112. The display panel may further include a first insulation layer 60 between the active layer PL and the first metal layer M1, a second insulation layer 61 between the first metal layer M1 and the second metal layer M2, and a third insulation layer 62 between the second metal layer M2 and the third metal layer M3, a planarization layer PLN between the third metal layer M3 and the anode layer RE, and a pixel define layer PDL on the side of the anode layer RE away from the first base substrate 30. The first light-transmitting hole 30 may pass through the first insulation layer 60, the second insulation layer 61, the third insulation layer 62, the planarization layer PLN, and the pixel define layer PDL.

In one embodiment, by passing through the first insulation layer 60, the second insulation layer 61, the third insulation layer 62, the planarization layer PLN, and the pixel define layer PDL through the first light-transmitting hole 20, external light may be enabled to enter the camera on the backlight side of the display panel through the plurality of the first light-transmitting hole 20, and the quantity and thicknesses of the film layers being passed through may be reduced, thereby reducing light loss and improving transmittance, and further improving the image forming quality of the camera which is on the backlight side of the display panel and corresponds to the first display region AB.

Figure 13:
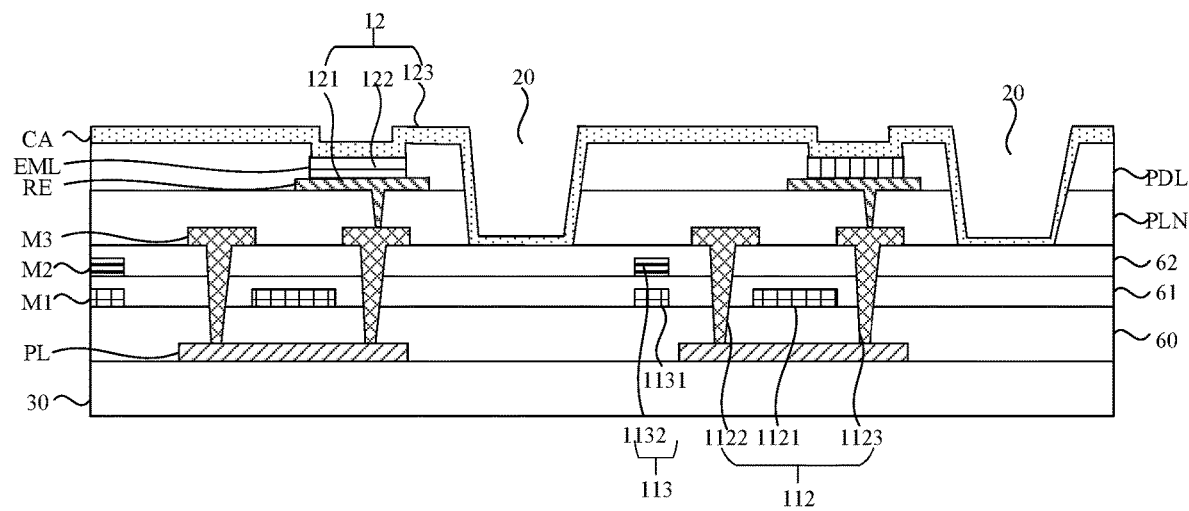
FIG. 13 illustrates another local structural schematic of a film layer of a first display region according to embodiments of the present disclosure.

It should be noted that the film layers passed through by the first light-transmitting hole 20 may not be limited to the above-mentioned embodiments, as long as the transmittance of the first light-transmitting hole 20 may be improved. In other optional embodiments, the first light-transmitting hole 20 may also pass through only the planarization layer PLN and the pixel define layer PDL. Exemplarily, FIG. 13 illustrates another local structural schematic of a film layer of the first display region according to embodiments of the present disclosure. As shown in FIG. 13, the first light-transmitting hole 20 may also pass through the planarization layer PLN and the pixel define layer PDL.

Figure 14:
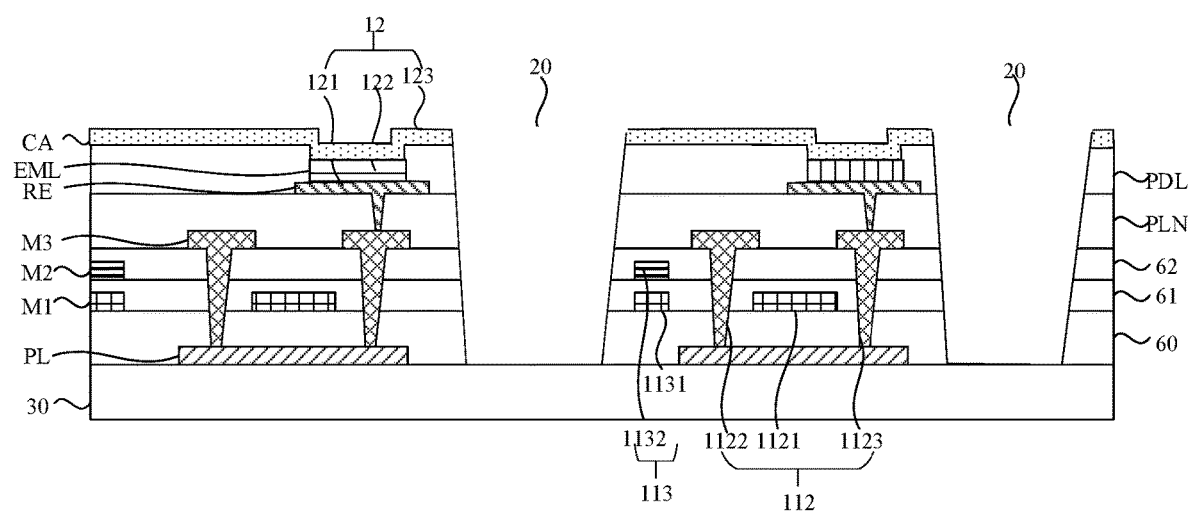
FIG. 14 illustrates another local structural schematic of a film layer of a first display region according to embodiments of the present disclosure.

Optionally, in order to further improve the transmittance, the first light-transmitting hole 20 may also pass through the cathode layer CA. That is, the area of the cathode layer CA corresponding to the first light-emitting hole 20 may be a hollow structure, as shown in FIG. 14.

Figure 15:
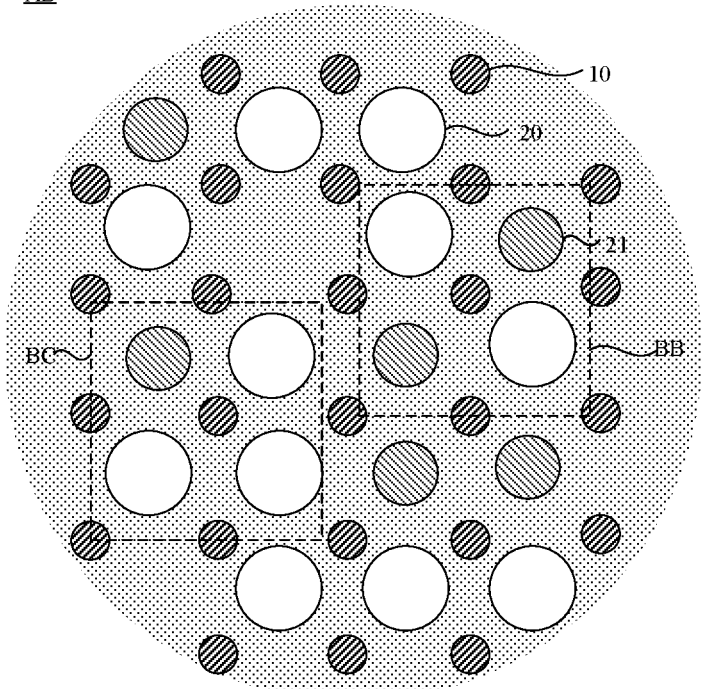
FIG. 15 illustrates another local structural schematic of a first display region according to embodiments of the present disclosure.

Optionally, FIG. 15 illustrates another local structural schematic of the first display region according to embodiments of the present disclosure. As shown in FIG. 15, the first display region AB may further include a plurality of second light-transmitting holes 21; along the direction perpendicular to the plane of the first base substrate 30, the second light-transmitting holes 21 may not overlap the light-emitting units 10; and the second light-transmitting holes 21 may be non-rectangular. The area of the first light-transmitting hole 20 is a first area S11 and the area of the second light-transmitting hole 21 is a second area S12, where S11>S12. In the first sub-display region BB, the sum of the areas of the second light-transmitting holes 21 per unit area is S3; and in the second sub-display region BC, the sum of the areas of the second light-transmitting holes 21 per unit area is S4, where S3<S4.

In one embodiment, the first display region AB may further include the plurality of second light-transmitting holes 21, and the areas of all second light-transmitting holes 21 may be equal to each other. The external light may enter the camera on the backlight side of the display panel through the plurality of the first light-transmitting holes 20 and the plurality of the second light-transmitting holes 21 to ensure that the camera receives sufficient light, thereby satisfying the image capturing function of the camera. Furthermore, the second light-transmitting holes 21 are non-rectangular, and the sum S3 of the areas of the second light-transmitting holes 21 per unit area in the first sub-display region BB is greater than the sum S4 of the areas of the second light-transmitting holes 21 per unit area in the second sub-display region BC. That is, the second light-transmitting holes 21 are non-rectangular and also arranged irregularly. Therefore, the diffraction may be avoided when the light passes through the second light-transmitting holes 21, and the image forming quality of the camera which is on the backlight side of the display panel and corresponds to the first display region AB may be improved.

Optionally, the shape of the second light-transmitting hole 21 may include at least one of the circle, the ellipse, and the rounded polygon. The shapes of the second light-transmitting holes 21 are exemplarily illustrated only as circles in FIG. 14. It should be noted that the shapes of the second light-transmitting holes 21 may include, but may not be limited to, the above-mentioned embodiments, and those skilled in the art may set the shapes of the second light-transmitting holes 21 according to product needs, which may not be limited in the embodiments of the present disclosure, as long as the light can be effectively prevented from diffracting when passing through the second light-transmitting holes 21 and the image forming quality can be improved. It should be understood that although the shapes of the second light-emitting holes 21 may be different, the areas of the second light-emitting holes 21 may be equal to each other.

Figure 16:
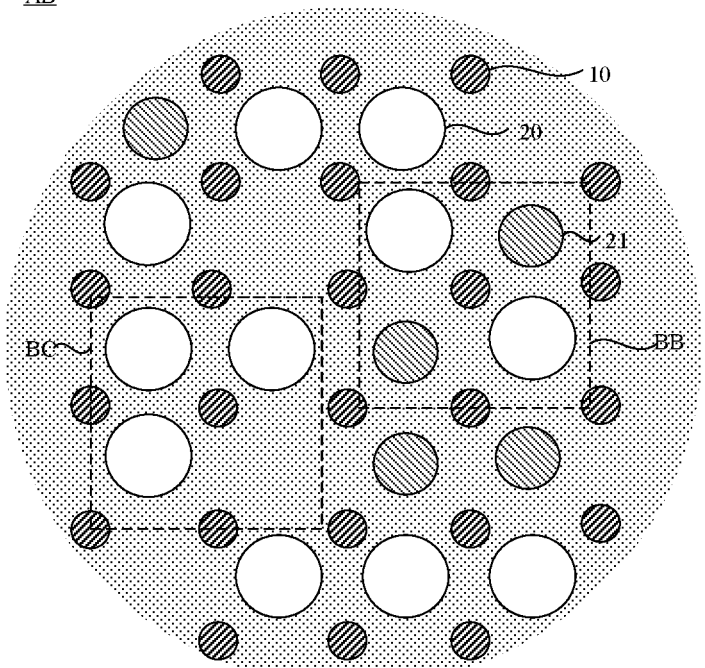
FIG. 16 illustrates another local structural schematic of a first display region according to embodiments of the present disclosure.

Optionally, FIG. 16 illustrates another local structural schematic of the first display region according to embodiments of the present disclosure. As shown in FIG. 16, the sum of the areas of the first light-transmitting holes 20 and the second light-transmitting holes 21 per unit area in the first sub-display region BB is S1+S3, and the sum of the areas of the first light-transmitting holes 20 and the second light-transmitting holes 21 per unit area in the second sub-display region BC is S2+S4, where S1+S3=S2+S4.

In the embodiments of the present disclosure, the diffraction may be effectively avoided when the light passes through the first light-transmitting holes 20 and the second light-transmitting holes 21. In addition, the sum of the areas of the first light-transmitting holes 20 and the second light-transmitting holes 21 per unit area in the first sub-display region BB is S1+S3, and the sum of the areas of the first light-transmitting holes 20 and the second light-transmitting holes 21 per unit area in the second sub-display region BC is S2+S4, where S1+S3=S2+S4. That is, the transmittance of the first sub-display region BB and the transmittance of the second sub-display region BC may be identical. That also is, based on that the first light-transmitting holes 20 and the second light-transmitting holes 21 are non-rectangular and arranged irregularly, the areas of the first sub-display region BB and the second sub-display region BC are enabled to be regular, which may effectively prevent light from diffracting when passing through the first light-transmitting holes 20 and the second light-transmitting holes 21, improve the uniformity of the transmittance of the first sub-display region BB and the transmittance of the second sub-display region AB, and further improve the image forming quality of the camera on the backlight side of the display panel.

Figure 17:
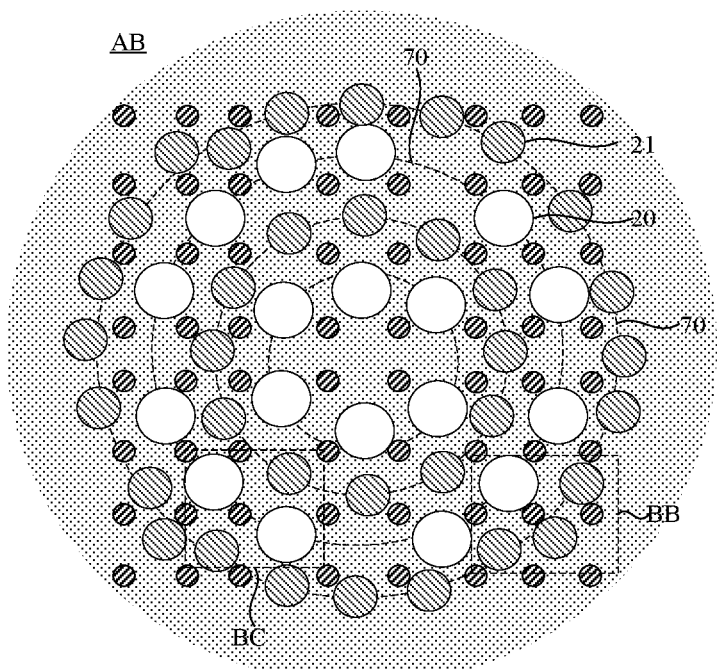
FIG. 17 illustrates another local structural schematic of a first display region according to embodiments of the present disclosure.
Figure 18:
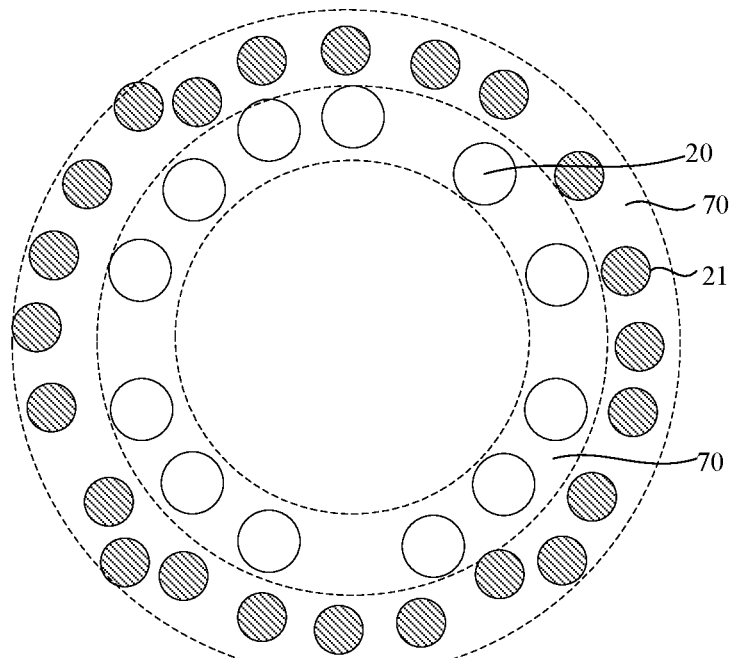
FIG. 18 illustrates a structural schematic of two first light-transmitting hole groups in FIG. 17.

Optionally, FIG. 17 illustrates another local structural schematic of the first display region according to embodiments of the present disclosure. FIG. 18 illustrates a structural schematic of two first light-transmitting hole groups in FIG. 17. As shown in FIGS. 17-18, the display panel may include a plurality of first light-transmitting hole groups 70; the light-transmitting holes in each first light-transmitting hole group 70 may be arranged along a ring shape; the plurality of first light-transmitting hole groups 70 may be arranged in a concentric ring; and the first light-transmitting hole group 70 may include at least one type of the first light-transmitting hole 20 and the second light-transmitting hole 21.

It should be noted that only four first light-transmitting hole groups 70 are used as an example in FIG. 17 for illustration, and only two outer first light-transmitting hole groups 70 are shown in FIG. 18 for illustration.

Figure 19:
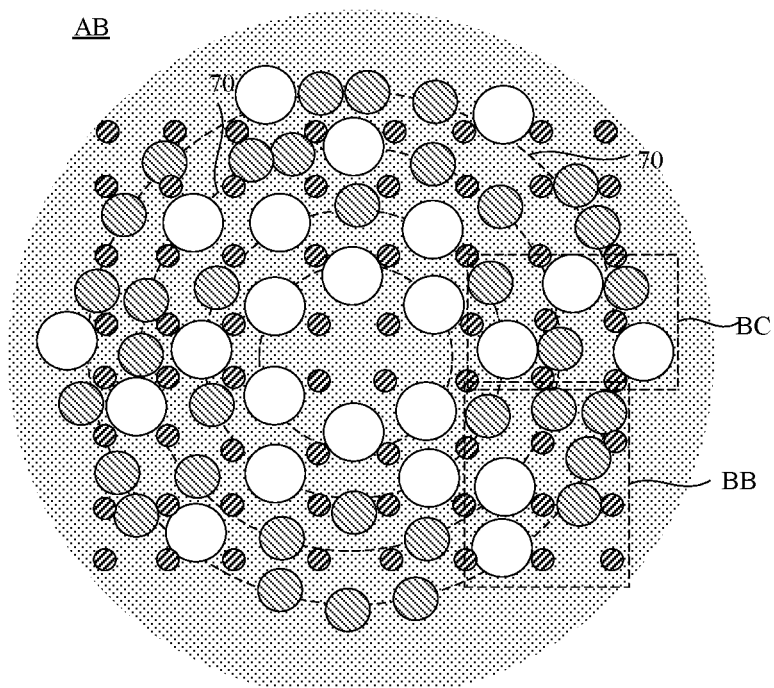
FIG. 19 illustrates another local structural schematic of a first display region according to embodiments of the present disclosure.

The light-transmitting holes of the first light-transmitting hole group 70 composed of at least one type of the first light-transmitting hole 20 and the second light-transmitting hole 21 may be arranged along a ring shape, and the radii of all first light-transmitting hole groups 70 may be different. Along the direction from the first display region AB to the second display region AA, the diameters of the first light-transmitting hole groups 70 may increase sequentially. One first light-transmitting hole group 70 may include only the plurality of first light-transmitting holes 20 or only the plurality of first light-transmitting holes 21, as shown in FIG. 16; or one first light-transmitting hole group 70 may include not only the plurality of first light-transmitting holes 20 but also the plurality of first light-transmitting holes 21, as shown in FIG. 19. When the light-transmitting holes of the first light-transmitting hole group 70 are arranged along a ring shape, the diffraction may further be avoided when the light passes through the first light-transmitting holes 20 and the second light-transmitting holes 21, and the image forming quality of the camera which is on the backlight side of the display panel and corresponds to the first display region AB may be improved.

Figure 20:
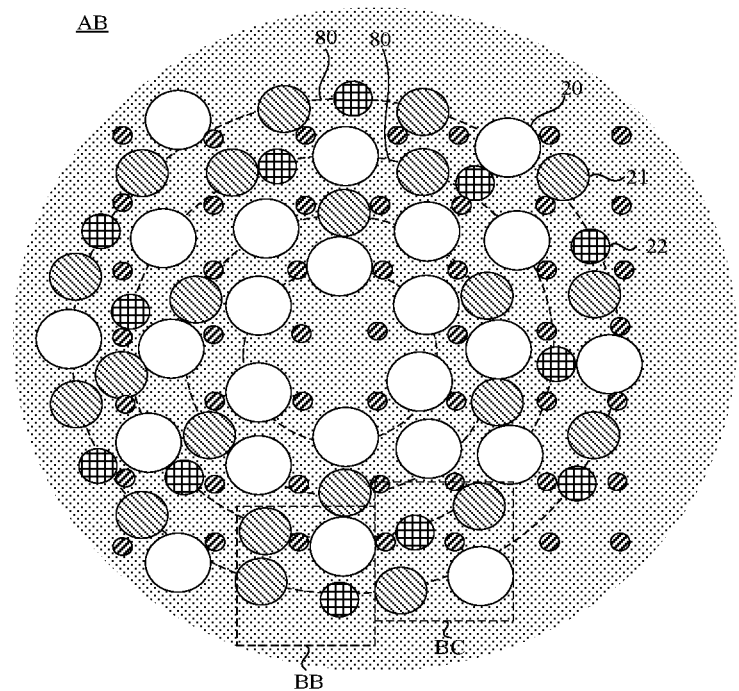
FIG. 20 illustrates another local structural schematic of a first display region according to embodiments of the present disclosure.

Optionally, FIG. 20 illustrates another local structural schematic of the first display region according to embodiments of the present disclosure. As shown in FIG. 20, the first display region AB may further include a plurality of third light-transmitting holes 22; along the direction perpendicular to the plane of the first base substrate 30, the third light-transmitting holes 22 may not overlap the light-emitting units 10; and the third light-transmitting holes 22 may be non-rectangular. The area of the third light-transmitting hole 20 is a third area S13, where S11>S12>S13. In the first sub-display region, the sum of the areas of the third light-transmitting holes 22 per unit area is S5; and in the second sub-display region, the sum of the areas of the third light-transmitting holes 22 per unit area is S6; the sum of the areas of the first light-transmitting holes 20, the second light-transmitting holes 21 and the third light-transmitting holes 22 per unit area in the first sub-display region BB is S1+S3+S5, and the sum of the areas of the first light-transmitting holes 20, the second light-transmitting holes 21 and the third light-transmitting holes 22 per unit area in the second sub-display region BC is S2−S4+S6, where S1+S3+S5=S2+S4+S6.

In one embodiment, the first display region AB may further include the plurality of third light-transmitting holes 22, and the areas of all third light-transmitting holes 21 may be equal to each other. The external light may enter the camera on the backlight side of the display panel through the plurality of the first light-transmitting holes 20, the plurality of the second light-transmitting holes 21 and the plurality of the third light-emitting holes 22 to ensure that the camera receives sufficient light, thereby satisfying the image capturing function of the camera. Furthermore, the third light-transmitting holes 22 are non-rectangular, such that the diffraction may be avoided when the light passes through the plurality of the third light-transmitting holes 22, and the image forming quality of the camera which is on the backlight side of the display panel and corresponds to the first display region AB may be improved. The sum S5 of the areas of the third light-transmitting holes 22 per unit area in the first sub-display region may be equal to or different from the sum S6 of the areas of the third light-transmitting holes 22 per unit area in the second sub-display region, which may not be limited according the embodiments of the present disclosure. However, the sum of the areas of the first light-transmitting holes 20, the second light-transmitting holes 21 and the third light-transmitting holes 22 per unit area in the first sub-display region BB is S1+S3−S5, and the sum of the areas of the first light-transmitting holes 20, the second light-transmitting holes 21 and the third light-transmitting holes 22 per unit area in the second sub-display region BC is S2+S4+S6, where S1+S3+S5=S2+S4+S6. That is, the transmittance of the first sub-display region BB and the transmittance of the second sub-display region BC may be identical, which may improve the uniformity of the transmittance of the first sub-display region BB and the transmittance of the second sub-display region AB, effectively prevent light from diffracting when passing through the first light-transmitting holes 20, the second light-transmitting holes 21 and the third light-transmitting holes 22, and further improve the image forming quality.

Figure 21:
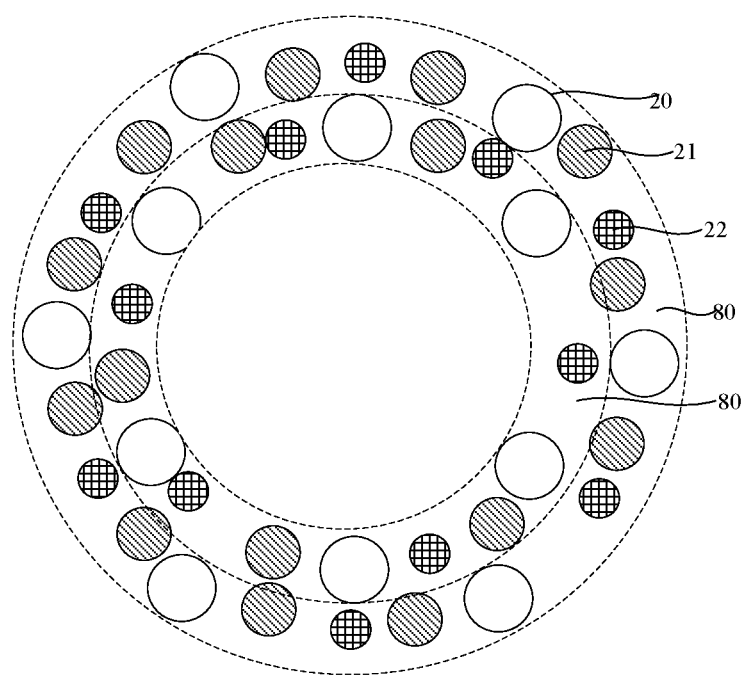
FIG. 21 illustrates a structural schematic of two second light-transmitting hole groups in FIG. 20.

Optionally, FIG. 20 illustrates another local structural schematic of the first display region according to embodiments of the present disclosure. As shown in FIGS. 20-21, the display panel may include a plurality of second light-transmitting hole groups 80; the light-transmitting holes in each second light-transmitting hole group 80 may be arranged along a ring shape; the plurality of second light-transmitting hole groups 80 may be arranged in a concentric ring; and the second light-transmitting hole group 80 may include at least one of the first light-transmitting holes 20, the second light-transmitting holes 21, and the third light-transmitting holes 22.

It should be noted that only four second light-transmitting hole groups 80 are used as an example in FIG. 20 for illustration, and only two outer second light-transmitting hole groups 80 are shown in FIG. 21 for illustration.

The light-transmitting holes of the second light-transmitting hole group 80 composed of at least one type of the first light-transmitting hole 20, the second light-transmitting hole 21 and the third light-transmitting hole 22 may be arranged along a ring shape, and the radii of all second light-transmitting hole groups 80 may be different. Along the direction from the first display region AB to the second display region AA, the diameters of the second light-transmitting hole groups 80 may increase sequentially. One second light-transmitting hole group 80 may include only one type of the first light-transmitting hole 20, the second light-transmitting hole 21, and the third light-transmitting hole 22; or one second light-transmitting hole group 80 may include two types of the first light-transmitting hole 20, the second light-transmitting hole 21, and the third light-transmitting hole 22; or one second light-transmitting hole group 80 may include all types of the first light-transmitting hole 20, the second light-transmitting hole 21, and the third light-transmitting hole 22, which may not be limited according to the embodiments of the present disclosure. When the light-transmitting holes of the second light-transmitting hole groups 80 are arranged along a ring shape, the diffraction may further be avoided when the light passes through the first light-transmitting holes 20, the second light-transmitting holes 21 and the third light-transmitting holes 22, and the image forming quality of the camera which is on the backlight side of the display panel and corresponds to the first display region AB may be improved.

It should be understood that, when the light-transmitting holes of the second light-transmitting hole groups 80 are arranged along a ring shape, the diffraction may further be avoided when the light passes through the first light-transmitting holes 20, the second light-transmitting holes 21 and the third light-transmitting holes 22. However, the light-emitting elements 10 in the first display region AB are arranged in an array, and the first light-transmitting holes 20, the second light-transmitting holes 21 and the third light-transmitting holes 22 may not overlap the light-emitting elements 10 along the direction perpendicular to the plane of the first base substrate 30. Along the direction from the first display region AB to the second display region AA, the diameters of the second light-transmitting hole groups 80 may increase sequentially. In order to satisfy that the light-transmitting holes of the light-transmitting hole groups formed by the light-transmitting holes are arranged along a ring shape and the light-transmitting holes do not overlap the light-emitting elements 10, only the areas of the light-transmitting holes can be modified, such that each light-transmitting hole is in the light-transmitting hole group where the light-transmitting holes are arranged along a ring shape. In such way, it is ensured that the light-transmitting holes of the light-transmitting hole groups formed by all light-transmitting holes may be arranged along a ring shape, and the sum of the areas of all light-transmitting holes per unit area in the first sub-display region may be equal to the sum of the areas of all light-transmitting holes per unit area in the second sub-display region. The display panel may further include a plurality of fourth light-transmitting holes and a plurality of fifth light-transmitting holes. The areas of the light-transmitting holes of a same type are same. For example, the areas of the plurality of fourth light-transmitting holes are equal to each other, and the areas of the plurality of fifth light-transmitting holes are equal to each other. The areas of the light-transmitting holes of different types are different. For example, the area of the first light-transmitting hole is greater than the area of the second light-transmitting hole, and the area of the second light-transmitting hole is greater than the area of the third light-transmitting hole, which may not be limited according to the embodiment of the present disclosure, as long as it is ensured that the light-transmitting holes of the light-transmitting hole groups formed by all light-transmitting holes are arranged along a ring shape, and the sum of the areas of all light-transmitting holes per unit area in the first sub-display region is equal to the sum of the areas of all light-transmitting holes per unit area in the second sub-display region.

Figure 22:
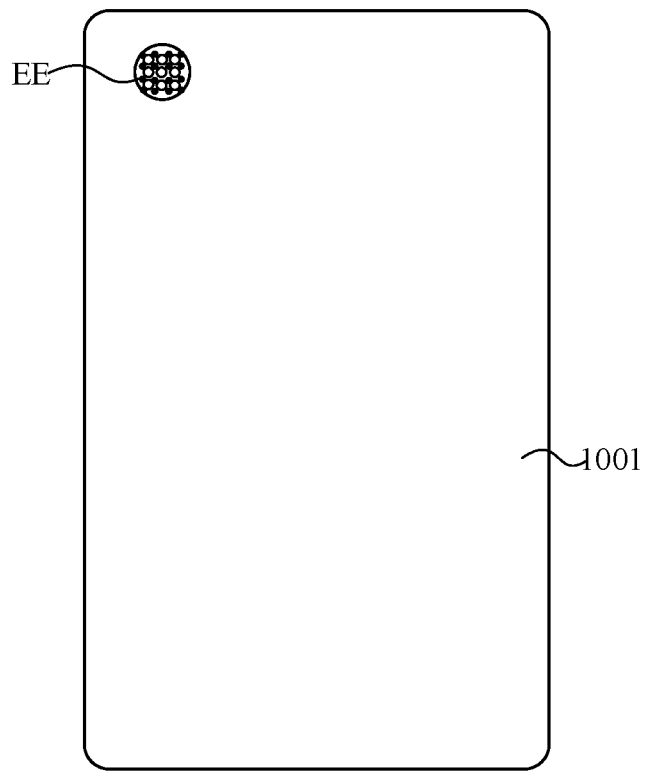
FIG. 22 illustrates a structural schematic of a display device according to embodiments of the present disclosure.

Based on the same concept, the embodiments of the present disclosure further provide a display device including the display panel of any embodiments of the present disclosure. For example, FIG. 22 illustrates a structural schematic of the display device according to embodiments of the present disclosure. As shown in FIG. 22, a display device 1000 may include a display panel 1001 according to the above-mentioned embodiments. Therefore, the display device 1000 provided in the embodiments of the present disclosure may also have the beneficial effects provided in the above-mentioned embodiments, which may not be described in detail herein. Exemplarily, the display device 1000 may be an electronic device such as a mobile phone, a computer, a smart wearable device (e.g., a smart watch), and a vehicle-mounted display device, which may not be limited in the embodiment of the present disclosure.

Figure 23:
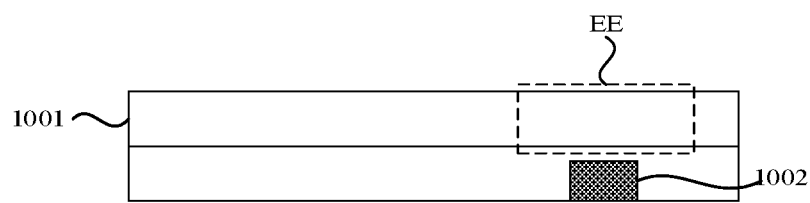
FIG. 23 illustrates a structural schematic of a film layer of a display device according to embodiments of the present disclosure.

Optionally, FIG. 23 illustrates a structural schematic of a film layer of the display device according to embodiments of the present disclosure. As shown in FIG. 23, the display device 1000 may further include a sensor 1002; the display panel 1001 may further include a sensor reserved region EE; the sensor 1002 may be disposed at the sensor reserved region EE, where the first display region may be multiplexed as the sensor reserved region EE.

The sensor 1002 may be, for example, the camera, and the light-sensitive surface of the sensor 1002 may face toward the display panel 1001. The display device provided in the embodiments of the present disclosure may have a full-screen display effect, and the image forming quality of the camera may be desirable when the sensor 1002 is the camera.

From the above-mentioned embodiments, it can be seen that the display module and the method for monitoring backlight brightness provided by the present disclosure may achieve at least the following beneficial effects.

The display panel and the display device are provided in the embodiments of the present disclosure. The display panel may include the first display region and the second display region surrounding the first display region. The display panel may further include the first substrate, and the first substrate may include the first base substrate. The first display region may include the plurality of light-emitting units on the first base substrate. The light-emitting units may include drive circuits and organic light-emitting elements, and the drive circuits may be used to drive the organic light-emitting elements to emit light. The first display region may include the plurality of first light-transmitting holes, the first light-transmitting holes may not overlap the light-emitting units along the direction perpendicular to the plane of the first base substrate, and the first light-transmitting holes may be non-rectangular. The first display region may include the first sub-display region and the second sub-display region. In the first sub-display region, the sum of the areas of the first light-transmitting holes per unit area is S1 and in the second sub-display region, the sum of the areas of the first light-transmitting holes per unit area is S2, where S1>S2. With the above-mentioned technical solution, by disposing the plurality of first light-transmitting holes in the first display region, external light may enter the camera on the backlight side of the display panel through the plurality of the first light-transmitting holes to ensure that the camera receives sufficient light, thereby satisfying the image capturing function of the camera. Meanwhile, by disposing the plurality of first light-emitting units in the first display region, when the display panel is required for performing display, the normal display of the first display region may be achieved through the plurality of light-emitting units, thereby increasing the body-to-screen ratio of the display panel and achieving the full-screen display. In addition, since the first light-transmitting holes are non-rectangular, the diffraction may be effectively reduced when the light passes through the first light-transmitting holes, and the image forming quality of the camera which is located on the backlight side of the display panel and corresponds to the first display region AB. Furthermore, since the sum S1 of the areas of the first light-transmitting holes per unit area in the first sub-display region is greater than the sum S2 of the areas of the first light-transmitting holes per unit area in the second sub-display region, that is, the first light-transmitting holes are arranged irregularly in the first display region, the diffraction may be further be avoided to improve the image forming quality.

The above-mentioned description may merely be the preferred embodiments of the present invention and the technical principles applied. Those skilled in the art should understand that the present disclosure may not be limited to the above-mentioned embodiments described herein, and may make various obvious changes, readjustments and substitutions without departing from the protection scope of the present disclosure. Therefore, although the present disclosure has been described in detail through the above-mentioned embodiments, the present disclosure may not be limited to the above-mentioned embodiments. Without departing from the concept of the present disclosure, more equivalent embodiments may be included, and the scope of the present disclosure may be determined by the scope of the appended claims.

What is claimed is:

1. A display panel, comprising:
a first display region and a second display region, wherein the second display region at least partially surrounding the first display region; and
a first substrate, including a first base substrate, wherein the first display region includes:
a plurality of organic light-emitting elements on the first base substrate; and
a first sub-display region and a second sub-display region, wherein:
the first sub-display region includes a plurality of first sub-light-transmitting holes, wherein the plurality of first sub-light-transmitting holes do not overlap the plurality of organic light-emitting elements along a direction perpendicular to a plane of the first base substrate, and the plurality of first sub-light-transmitting holes are non-rectangular;
the second sub-display region includes a plurality of second sub-light-transmitting holes, wherein the plurality of second sub-light-transmitting holes do not overlap the plurality of organic light-emitting elements along a direction perpendicular to a plane of the first base substrate, and the plurality of second sub-light-transmitting holes are non-rectangular; and
at least one of the plurality of first sub-light-transmitting holes and at least one of the plurality of second sub-light-transmitting holes have different shapes.

2. The display panel according to claim 1, wherein:
an area of the at least one of the plurality of first sub-light-transmitting holes equals an area of the at least one of the plurality of second sub-light-transmitting holes.

3. The display panel according to claim 1, wherein:
a sum of areas of the plurality of first sub-light-transmitting holes per unit area in the first sub-display region does not equal a sum of areas of the plurality of first sub-light- transmitting holes per unit area in the second sub-display region; or
a sum of areas of the plurality of second sub-light-transmitting holes per unit area in the first sub-display region does not equal a sum of areas of the plurality of second sub-light- transmitting holes per unit area in the second sub-display region.

4. The display panel according to claim 1, further including:
a light-shielding layer, located at the first display region and on the first base substrate, wherein:
the light-shielding layer includes a plurality of first openings, a plurality of second openings, and a plurality of third openings;
along the direction perpendicular to the plane of the first base substrate, a plurality of organic light-emitting elements at least partially overlap the plurality of first openings; and
the plurality of first sub-light-transmitting holes include the plurality of second openings, and the plurality of second sub-light-transmitting holes include the plurality of third openings.

5. The display panel according to claim 1, wherein:
the light-shieling layer is made of one of a black photoresist or a black metal.

6. The display panel according to claim 4, wherein:
the organic light-emitting element includes an anode on a side of the first base substrate, a light-emitting layer on a side of the anode away from the first base substrate, and a cathode on a side of the light-emitting layer away from the anode; and
the light-shieling layer is on a side of the cathode away from the first base substrate.

7. The display panel according to claim 4, wherein:
the organic light-emitting element includes an anode on a side of a drive circuit away from the first base substrate, a light-emitting layer on a side of the anode away from the drive circuit, and a cathode on a side of the light-emitting layer away from the anode; and the anode and the light-shielding layer are disposed in a same layer.

8. The display panel according to claim 4, wherein:

the first sub-display region includes a drive circuit electrically connected to the plurality of organic light-emitting elements;

the drive circuit includes a thin film transistor and a storage capacitor; the storage capacitor includes a first electrode plate and a second electrode plate; the thin film transistor includes a gate electrode, a source electrode, and a drain electrode; and the organic light-emitting element includes an anode, a light-emitting layer, and a cathode;

the display panel includes a blocking layer on the first base substrate, a first metal layer on a side of the blocking layer away from the first base substrate, a second metal layer on a side of the first metal layer away from the first base substrate, a third metal layer on a side of the second metal layer away from the first base substrate, an anode layer on a side of the third metal layer away from the first base substrate, an light-emitting layer on a side of the anode layer away from the first base substrate, and a cathode layer on a side of the light-emitting layer away from the first base substrate;

the blocking layer includes a light-shielding portion located on a side of the gate electrode of the thin film transistor adjacent to the first base substrate;

the first metal layer includes the gate electrode of the thin film transistor and the first electrode plate of the storage capacitor;

the second metal layer includes the second electrode plate of the storage capacitor; and the third metal layer includes the source electrode and the drain electrode of the thin film transistor.

9. The display panel according to claim 8, wherein:

the blocking layer further includes the light-shielding layer.

10. The display panel according to claim 8, further including:

a fourth metal layer on a side of the third metal layer away from the first base substrate, wherein the fourth metal layer includes the light-shielding layer.

11. The display panel according to claim 8, wherein:

the anode layer includes the anode of the organic light-emitting element and the light- shielding layer.

12. The display panel according to claim 1, wherein:

the first sub-display region includes [[the]]a drive circuit electrically connected to the plurality of organic light-emitting elements;

along the direction perpendicular to the plane of the first base substrate, the plurality of first sub-light-transmitting holes include an area enclosed by adjacent light-emitting elements, pixel circuits, and connecting wiring between adjacent pixel circuits;

the plurality of second sub-light-transmitting holes include an area enclosed by adjacent light-emitting elements, the pixel circuits, and connecting wiring between adjacent pixel circuits.

13. The display panel according to claim 1, further including:

a plurality of insulation layers, wherein the plurality of first sub-light-transmitting holes include and pass through an area including at least one of the plurality of insulation layers and the plurality of second sub-light-transmitting holes include and pass through the area including at least one of the plurality of insulation layers.

14. The display panel according to claim 13, wherein:

the first sub-display region includes a drive circuit electrically connected to the plurality of organic light-emitting elements;

the drive circuit includes a thin film transistor and a storage capacitor; the storage capacitor includes a first electrode plate and a second electrode plate; the thin film transistor includes a gate electrode, a source electrode, and a drain electrode; and the organic light-emitting element includes an anode, a light-emitting layer, and a cathode;

the display panel includes an active layer on a side of the first base substrate, a first metal layer on a side of the active layer away from the first base substrate, a second metal layer on a side of the first metal layer away from the first base substrate, a third metal layer on a side of the second metal layer away from the first base substrate, an anode layer on a side of the third metal layer away from the first base substrate, a light-emitting layer on a side of the anode layer away from the first base substrate, and a cathode layer on a side of the light-emitting layer away from the first base substrate, wherein the first metal layer includes the gate electrode of the thin film transistor and the first electrode plate of the storage capacitor;

the second metal layer includes the second electrode plate of the storage capacitor; and the third metal layer includes the source electrode and the drain electrode of the thin film transistor;

the plurality of insulation layers include a first insulation layer, a second insulation layer, a third insulation layer, the planarization layer, and the pixel define layer;

the first insulation layer is between the active layer and the first metal layer, the second insulation layer is between the first metal layer and the second metal layer, and the third insulation layer is between the second metal layer and the third metal layer, the planarization layer is between the third metal layer and the anode layer, and the pixel define layer is on a side of the anode layer away from the first base substrate; and the plurality of first sub-light-transmitting holes pass through an area including at least one of the first insulation layer, the second insulation layer, the third insulation layer, the planarization layer, the pixel define layer, and the cathode; or the plurality of second sub-light-transmitting holes pass through the area including at least one of the first insulation layer, the second insulation layer, the third insulation layer, the planarization layer, the pixel define layer, and the cathode.

15. The display panel according to claim 1, further including:

a plurality of first sub-light-transmitting hole groups and a plurality of second sub-light- transmitting hole groups, wherein:

at least one of the plurality of first sub-light-transmitting hole groups are arranged along a ring shape; and at least one of the plurality of second sub-light-transmitting hole groups are arranged along a ring shape.

16. The display panel according to claim 15, wherein:

at least two of the plurality of first sub-light-transmitting hole groups are arranged in a concentric ring; and at least two of the plurality of second sub-light-transmitting hole groups are arranged in a concentric ring.

17. The display panel according to claim 1, further including:
the plurality of first sub-light-transmitting holes include at least one type of a circle, an ellipse, and a rounded polygon.

18. A display device, comprising:
a display panel, comprising:
a first display region and a second display region, wherein the second display region at least partially surrounding the first display region; and
a first substrate, including a first base substrate, wherein the first display region includes:
a plurality of organic light-emitting elements on the first base substrate; and
a first sub-display region and a second sub-display region, wherein:
the first sub-display region includes a plurality of first sub-light-transmitting holes, wherein the plurality of first sub-light-transmitting holes do not overlap the plurality of organic light-emitting elements along a direction perpendicular to a plane of the first base substrate, and the plurality of first sub-light-transmitting holes are non-rectangular;
the second sub-display region includes a plurality of second sub-light-transmitting holes, wherein the plurality of second sub-light-transmitting holes do not overlap the plurality of organic light-emitting elements along a direction perpendicular to a plane of the first base substrate, and the plurality of second sub-light-transmitting holes are non-rectangular; and
at least one of the plurality of first sub-light-transmitting holes and at least one of the plurality of second sub-light-transmitting holes have different shapes.

19. The display device according to claim 18, further including:
a sensor, wherein the display panel further includes a sensor reserved region; the sensor is disposed at the sensor reserved region; and the first display region is multiplexed as the sensor reserved region.

20. The display panel according to claim 18, wherein:
a sum of areas of the plurality of first sub-light-transmitting holes per unit area in the first sub-display region does not equal a sum of areas of the plurality of first sub-light-transmitting holes per unit area in the second sub-display region; or
a sum of areas of the plurality of second sub-light-transmitting holes per unit area in the first sub-display region does not equal a sum of areas of the plurality of second sub-light-transmitting holes per unit area in the second sub-display region.

* * * * *